United States Patent
Kim et al.

(10) Patent No.: US 10,692,761 B2
(45) Date of Patent: Jun. 23, 2020

(54) SELECTIVELY CONTROLLING APPLICATION OF A SELF-ASSEMBLED MONOLAYER COATING ON A SUBSTRATE OF A DEVICE FOR FACILITATING A REDUCTION OF ADVERSE EFFECTS OF SUCH COATING ON THE DEVICE

(71) Applicant: INVENSENSE, INC., San Jose, CA (US)

(72) Inventors: Bongsang Kim, Mountain View, CA (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/387,469

(22) Filed: Apr. 17, 2019

(65) Prior Publication Data

US 2019/0341305 A1    Nov. 7, 2019

Related U.S. Application Data

(60) Provisional application No. 62/667,239, filed on May 4, 2018.

(51) Int. Cl.
  *B81B 3/00*  (2006.01)
  *H01L 21/768*  (2006.01)
  (Continued)

(52) U.S. Cl.
  CPC .......... *H01L 21/76865* (2013.01); *B81B 7/02* (2013.01); *B81C 1/00373* (2013.01);
  (Continued)

(58) Field of Classification Search
  CPC . B81C 1/00626; B81B 7/02; H01L 21/76865; H01L 21/02304; H01L 21/02499; H01L 21/8238
  See application file for complete search history.

(56) References Cited

U.S. PATENT DOCUMENTS 9,221,677 B2 * 12/2015 Kim .................... H01H 1/0036
2016/0347605 A1 * 12/2016 Thompson ............ B81B 3/0086

OTHER PUBLICATIONS

Wikipedia. "Self-assembled monolayer" [https://en.wikipedia.org/wiki/Selfassembled_monolayer] retrieved Mar. 27, 2019, 12 pages.

* cited by examiner

*Primary Examiner* — Matthew L Reames
(74) *Attorney, Agent, or Firm* — Amin, Turocy & Watson, LLP (57) ABSTRACT

Selectively controlling application of a self-assembled monolayer (SAM) coating on a substrate of a device is presented herein. A method comprises: forming a material on a first substrate; removing a selected portion of the material from a defined contact area of the first substrate; forming a SAM coating on the material and the defined contact area—the SAM coating comprising a first adhesion force with respect to the material and a second adhesion force with respect to the defined contact area, and the first adhesion force being less than the second adhesion force; removing the SAM coating that has been formed on the material; and attaching the first substrate to the second substrate—the first substrate being positioned across from the second substrate, and the SAM coating that has been formed on the defined contact area being positioned across from a bump stop of the second substrate.

20 Claims, 11 Drawing Sheets

(51) Int. Cl.
*H01L 21/02* (2006.01)
*H01L 21/8238* (2006.01)
*B81C 1/00* (2006.01)
*B81B 7/02* (2006.01)

(52) U.S. Cl.
CPC .... *B81C 1/00626* (2013.01); *H01L 21/02304* (2013.01); *H01L 21/02499* (2013.01); *H01L 21/8238* (2013.01)

SELECTIVELY CONTROLLING APPLICATION OF A SELF-ASSEMBLED MONOLAYER COATING ON A SUBSTRATE OF A DEVICE FOR FACILITATING A REDUCTION OF ADVERSE EFFECTS OF SUCH COATING ON THE DEVICE

CROSS-REFERENCE TO RELATED APPLICATION

This patent application claims priority to U.S. Provisional Patent Application No. 62/667,239, filed on May 4, 2018, and entitled "SAM CHARGING MITIGATION PLAN," the entirety of which is hereby incorporated by reference herein.

TECHNICAL FIELD

This disclosure generally relates to embodiments for selectively controlling application of a self-assembled monolayer (SAM) coating on a substrate of a device for facilitating a reduction of adverse effects of such coating on the device.

BACKGROUND

Conventional semiconductor technologies apply a SAM coating to an entire exposed silicon surface of a substrate to reduce stiction of the substrate. For example, the SAM coating can be applied to an entire surface of a proof mass of a sensor in order to reduce stiction of the proof mass. However, outgassing of the SAM coating changes a pressure in a cavity corresponding to the proof mass—negatively shifting sensor performance. Further, the SAM coating can alter a charge of the sensor—negatively impacting reliability testing of the sensor. Consequently, conventional semiconductor technologies have had some drawbacks, some of which may be noted with reference to the various embodiments described herein.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventionally, coating an entire surface of a substrate to reduce stiction can negatively affect the performance of a corresponding device due to charge shifting and outgassing. For example, outgassing of a SAM coating that has been applied to a proof mass of a sensor causes pressure to change in a cavity of the sensor—degrading sensor performance and/or requiring use of a getter in the cavity. Further, the SAM coating can induce changes in charge on a corresponding surface of the proof mass—effecting operation and/or reliability testing of the sensor. Various embodiments disclosed herein can facilitate a reduction of adverse effects of SAM coating on a device by selectively controlling application of SAM coating on a substrate of the device.

For example, in embodiment(s), a method, e.g., of manufacture, comprises forming a material, e.g., germanium, on a first substrate, a side of the first substrate, etc. In embodiment(s), the forming comprises depositing a layer of germanium on a side, surface, etc. of a silicon substrate; forming the material on a side, a surface, etc. of a proof mass of a gyroscope, an accelerometer; etc.

Further, the method comprises removing a selected portion of the material from a defined contact area of the first substrate, e.g., etching the selected portion of the material from the defined contact area.

In turn, the method further comprises forming a SAM coating on the material and the defined contact area, e.g., depositing the SAM coating on the material and the defined contact area; depositing the SAM coating on the material, the defined contact area, and respective sidewalls of the first substrate; etc.

In embodiment(s), the SAM coating comprises a first adhesion force, force of adhesion, etc. with respect to the material, e.g., germanium, and a second adhesion force, force of adhesion, etc. with respect to the defined contact area of the first substrate, e.g., the defined contact area comprising silicon. In this regard, the method further comprises removing, e.g., based on the first adhesion force, force of adhesion, etc. being less than the second adhesion force, force of adhesion, etc., the SAM coating that has been formed on the material—the SAM coating that has been formed on the defined contact area and the respective sidewalls remaining on the defined contact area and the respective sidewalls.

In one embodiment, the removing the SAM coating that has been formed on the material comprises heating the first substrate, the SAM coating, etc., and based on the first adhesion force, force of adhesion, etc. being less than the second adhesion force, force of adhesion, etc., removing the SAM coating that has been formed on the material in response to the heating the SAM coating that has been formed on the defined contact area and the respective sidewalls remaining on the defined contact area and the respective sidewalls.

In another embodiment, the removing the SAM coating that has been formed on the material comprises applying (e.g., via gas, deposition, etc.) a substance, chemical, etc. to the SAM coating that has been formed on the material, and based on the first adhesion force, force of adhesion, etc. being less than the second adhesion force, force of adhesion, etc., removing the SAM coating that has been formed on the material in response to the applying the substance, chemical, etc. to the SAM coating.

In turn, the method further comprises attaching, e.g., via a standoff of the first substrate, the first substrate across from a second substrate, e.g., a complementary metal-oxide-semiconductor (CMOS) substrate (e.g., comprising sensing element(s) of a gyroscope, an accelerometer, a magnetometer, a microphone, etc.; processing component(s) of the gyroscope, the accelerometer, the magnetometer, the microphone, etc. . . . ). In this regard, the SAM coating that has been formed on the defined contact area is positioned across from a bump stop of the second substrate—the SAM coating reducing stiction between the defined contact area and the bump stop.

In other embodiment(s), a device, e.g., a micro-electro-mechanical system (MEMS) based accelerometer, a MEMS based gyroscope, a MEMS based magnetometer, a MEMS based microphone, etc. comprises a first substrate (e.g., proof mass), e.g., comprising silicon, etc. that comprises a surface—the surface comprising a non-contact area that has been covered with a material, e.g., germanium, and a contact area that has been covered with a SAM coating. Further, the device comprises a second substrate that has been assembled across from the first substrate—a bump stop of the second substrate being opposite from the contact area.

In yet other embodiment(s), a method, e.g., of manufacture, comprises depositing germanium on a side of a proof mass comprising silicon; selectively etching the germanium from a defined contact area of the side of the proof mass; applying a SAM coating conformally over a first portion of the proof mass comprising the germanium and a second portion of the proof mass comprising the defined contact area; removing the SAM coating from the first portion of the proof mass comprising the germanium; and assembling, via a standoff of the proof mass, the proof mass to a CMOS substrate—a bump stop of the CMOS substrate being opposite from the defined contact area.

In one embodiment, the removing the SAM coating comprises removing the SAM coating from the first portion of the proof mass comprising the germanium in response to heating the proof mass, the SAM coating, etc. In another embodiment, the removing the SAM coating comprises chemically removing the SAM coating from the first portion of the proof mass comprising the germanium.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art.

Figure 1:
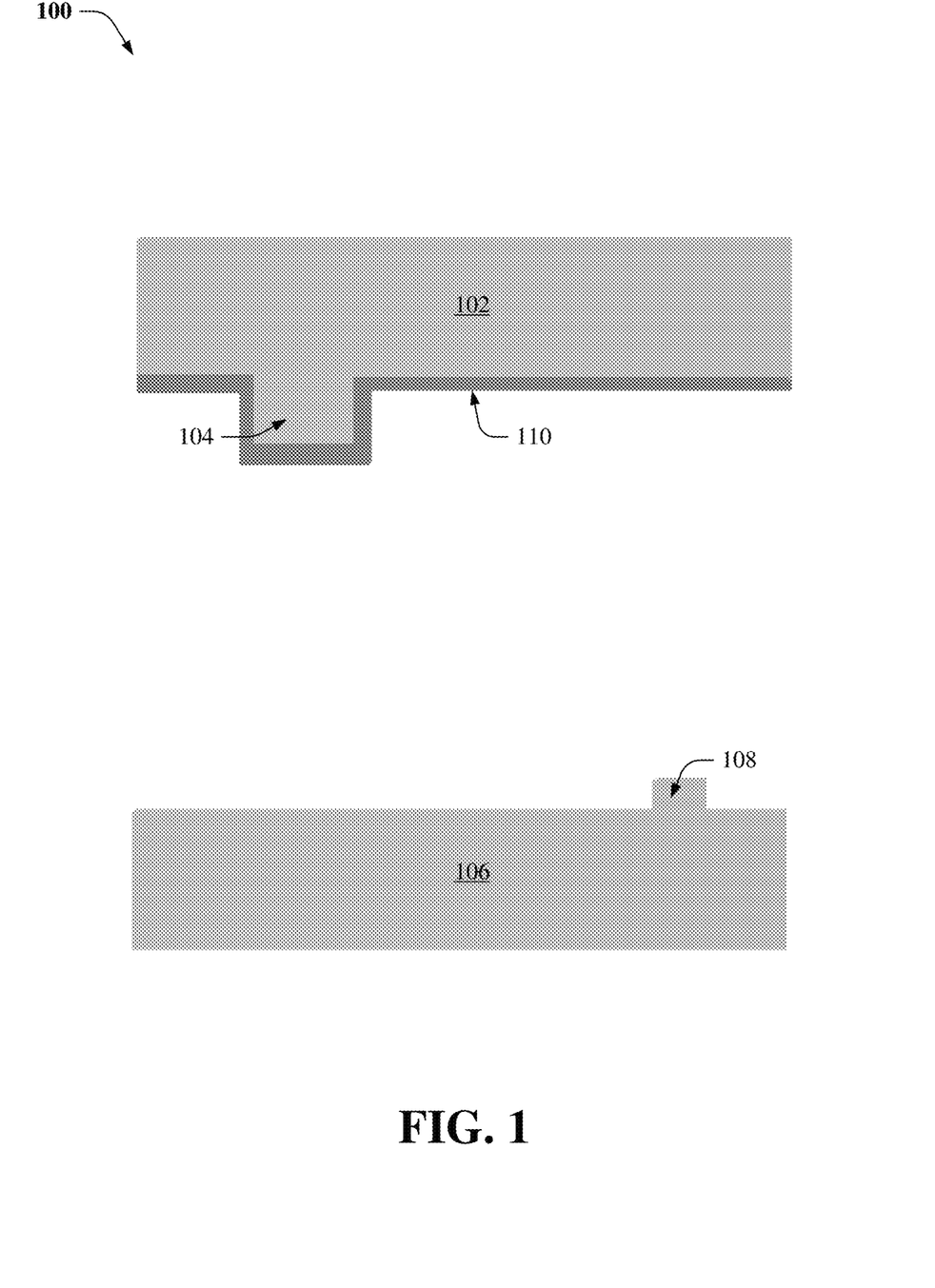
FIG. 1 illustrates a diagram of a cross section of substrates of a device in which a material has been formed on one of the substrates, in accordance with various example embodiments.

Referring now to FIG. 1, a diagram (100) of a cross section of substrates (102, 106) of a device, e.g., MEMS gyroscope, MEMS accelerometer, MEMS magnetometer, MEMS microphone etc. in which a material (110) has been formed on a first substrate (102) of the substrates is illustrated, in accordance with various example embodiments. As illustrated by FIG. 1, the first substrate comprises a standoff (104) that facilitates attachment of the first substrate to a second substrate (106) of the substrates comprising a bump stop (108). In embodiment(s), the first substrate can comprise silicon, polysilicon, monocrystalline silicon, a proof mass (e.g., of the MEMS gyroscope, the MEMS accelerometer, etc.), etc. Further, the material (110), e.g., germanium, can be deposited on the first substrate, a side of the first substrate, etc. In embodiment(s), the second substrate can comprise a CMOS substrate, e.g., comprising sensing element(s) (not shown) of a gyroscope, an accelerometer, a magnetometer, a microphone, etc.; comprising processing component(s) (not shown) of the gyroscope, the accelerometer, the magnetometer, the microphone, etc . . . .

Figure 2:
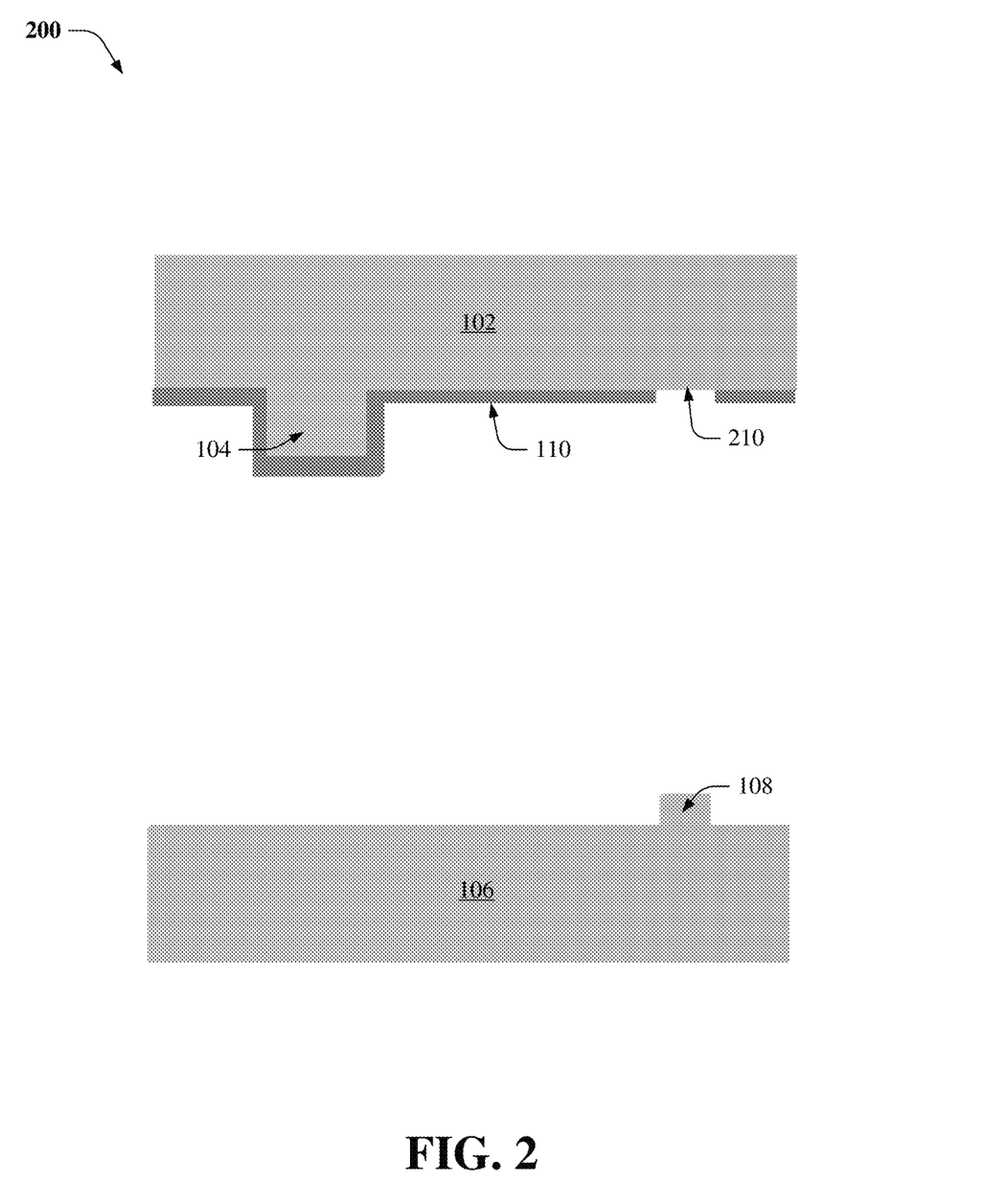
FIG. 2 illustrates a diagram of a cross section of the substrates in which a selected portion of the material that has been formed on one of the substrates has been removed from a defined contact area of such substrate, in accordance with various example embodiments.

FIG. 2 illustrates a diagram (200) of a cross section of the substrates (102, 106) in which a selected portion of the material (110) that has been formed the first substrate (102) has been removed from a defined contact area (210) of the first substrate, in accordance with various example embodiments. In this regard, in embodiment(s), the selected portion of the material can be removed from the first substrate by etching the selected portion of the material from the defined contact area.

Figure 3:
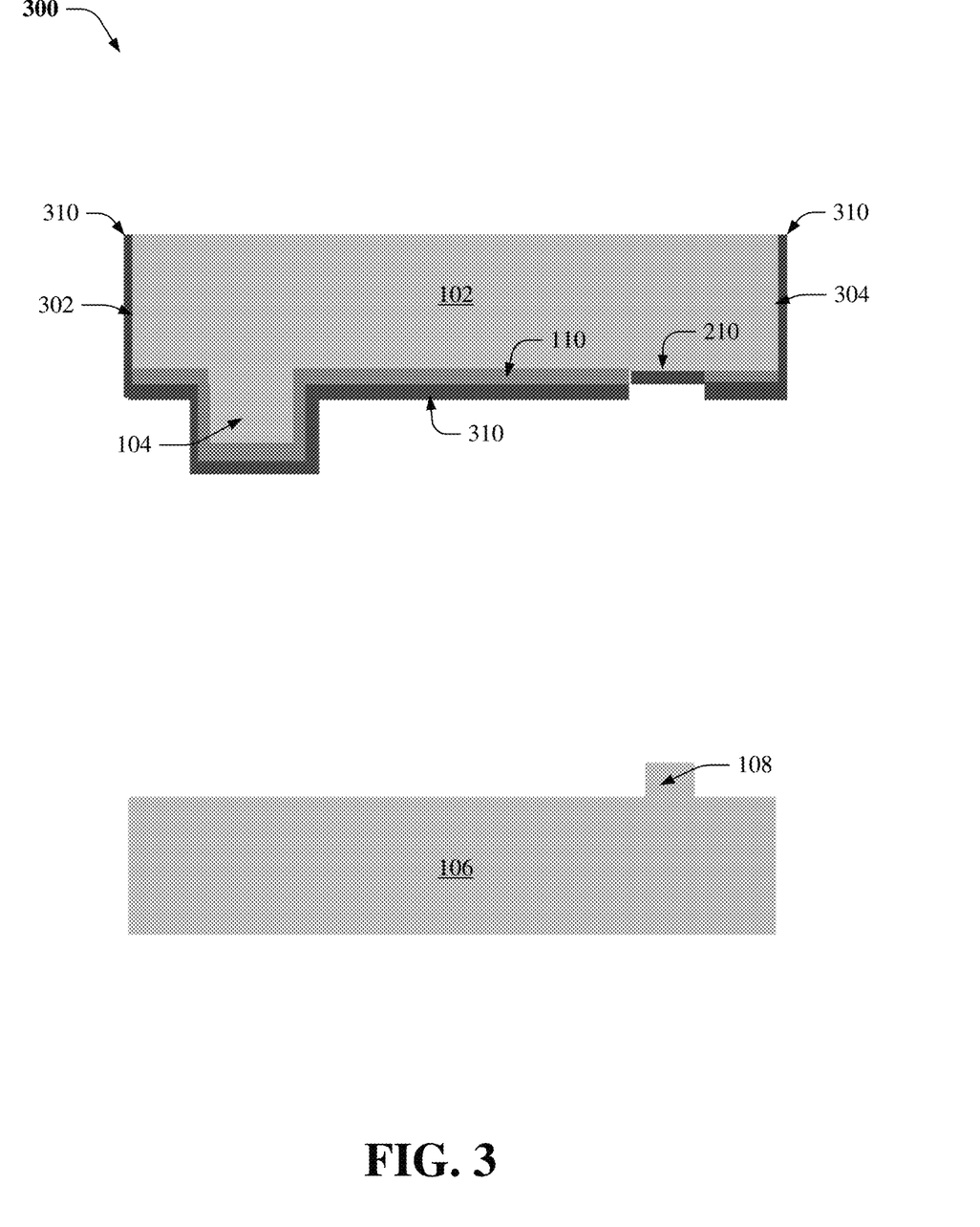
FIG. 3 illustrates a diagram of a cross section of the substrates in which a SAM coating has been formed on the material on one of the substrates, the defined contact area of such substrate, and respective sidewalls of such substrate, in accordance with various example embodiments.

In turn, as illustrated by FIG. 3, a SAM coating (310) can be formed on the material (110), the defined contact area (210), and on respective sidewalls (302, 304) of the first substrate (102). In embodiment(s), the SAM coating can be formed on the material, the defined contact area, and the respective sidewalls by depositing the SAM coating on such surfaces. In other embodiment(s) illustrated by FIG. 4, a SAM coating (310) can be formed only on the material (110) and the defined contact area (210) of the first substrate (102), e.g., by depositing the SAM coating on such surfaces.

Figure 4:
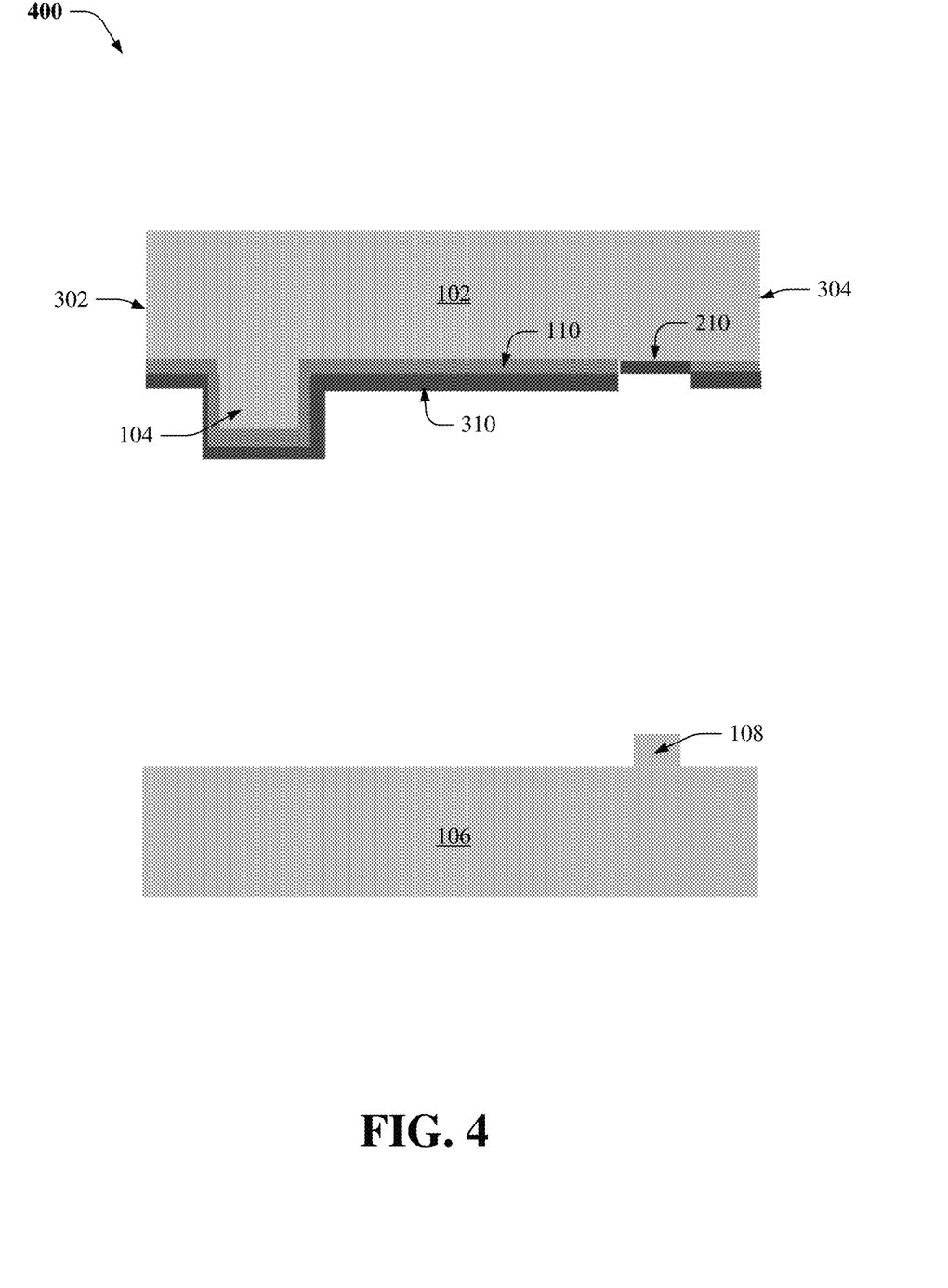
FIG. 4 illustrates a diagram of a cross section of the substrates in which a SAM coating has been formed on the material on one of the substrates and the defined contact area of such substrate, in accordance with various example embodiments.

In various embodiments, the SAM coating comprises different adhesion forces, forces of adhesion, etc. with respect to adhering to different materials. For example, the SAM coating can comprise a first force of adhesion, adhesion force, etc. with respect to adhering to the material, e.g., germanium, and a second force of adhesion, adhesion force, etc. with respect to adhering to the defined contact area of the first substrate, e.g., comprising silicon—the first adhesion force, force of adhesion, etc. being less than the second adhesion force, force of adhesion, etc.

Figure 5:
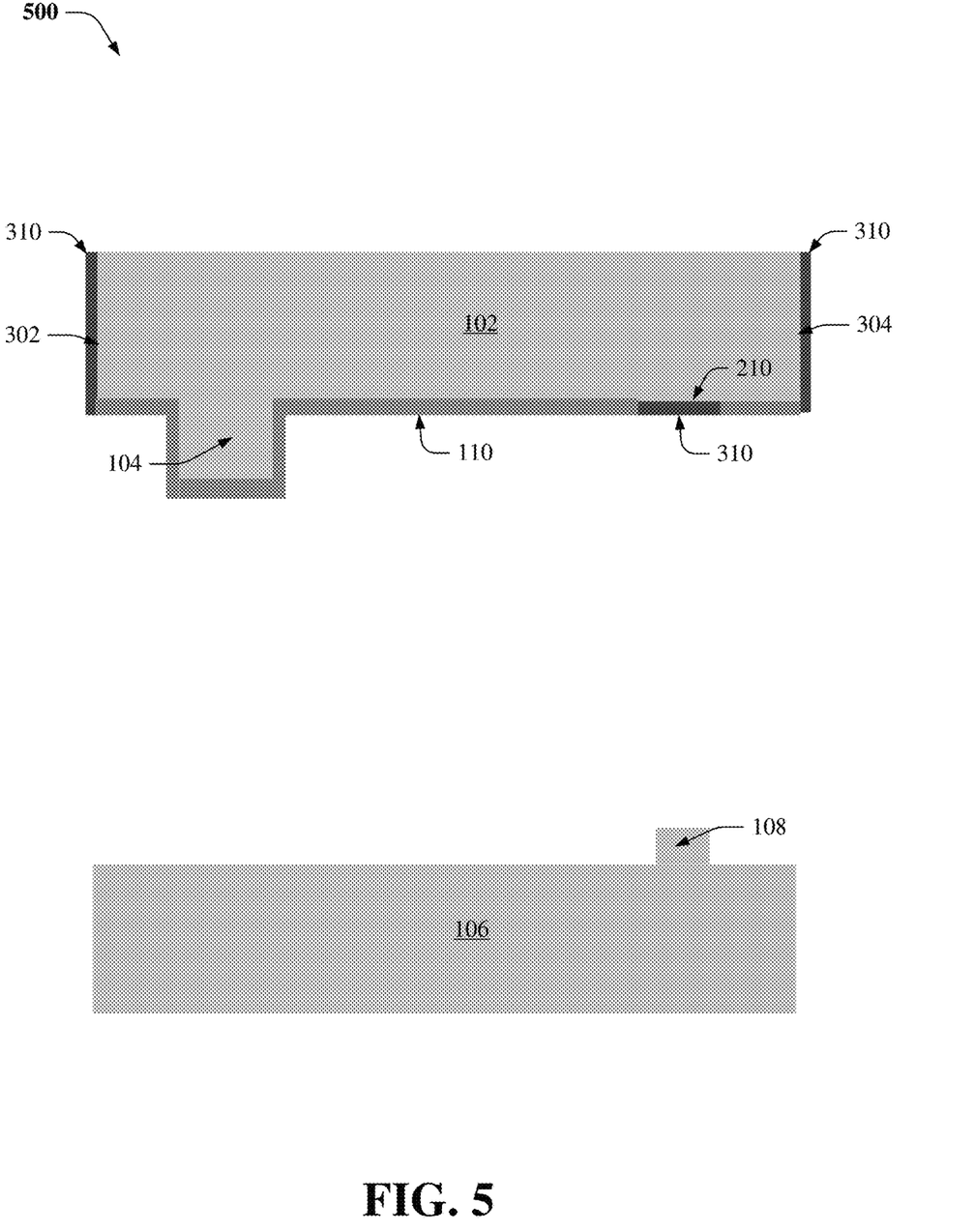
FIG. 5 illustrates a diagram of a cross section of the substrates in which a portion of the SAM coating that has been formed on the material on one of the substrates has been removed, while SAM coating that has been formed on the defined contact area of such substrate and respective sidewalls of such substrate remains, in accordance with various example embodiments.
Figure 6:
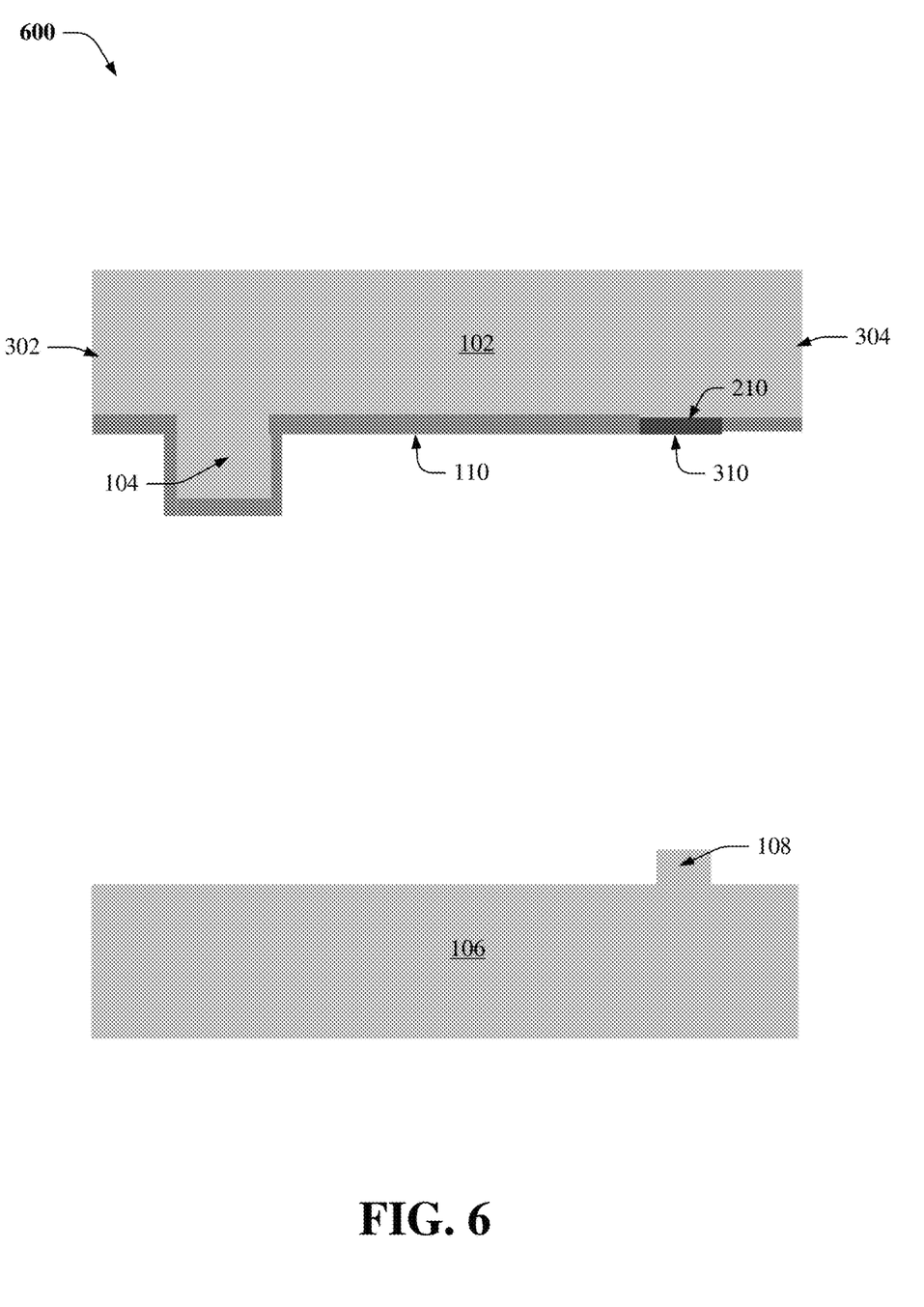
FIG. 6 illustrates a diagram of a cross section of the substrates in which a portion of the SAM coating that has been formed on the material on one of the substrates has been removed, while SAM coating that has been formed on the defined contact area of such substrate remains, in accordance with various example embodiments.

In this regard, as illustrated by FIGS. 5 and 6, based on the first adhesion force, force of adhesion, etc. being less than the second adhesion force, force of adhesion, etc., the SAM coating that has been formed on the material can be removed—leaving the SAM coating that has been formed on the defined contact area, the respective sidewalls, etc. to remain on the defined contact area, the respective sidewalls, etc.

For example, in embodiment(s), in response to heat being applied to the first substrate, the portion of the SAM coating that has been formed on the material, etc., and based on the first adhesion force, force of adhesion, etc. being less than the second adhesion force, force of adhesion, etc., the SAM coating that has been formed on the material can be removed.

Figure 7:
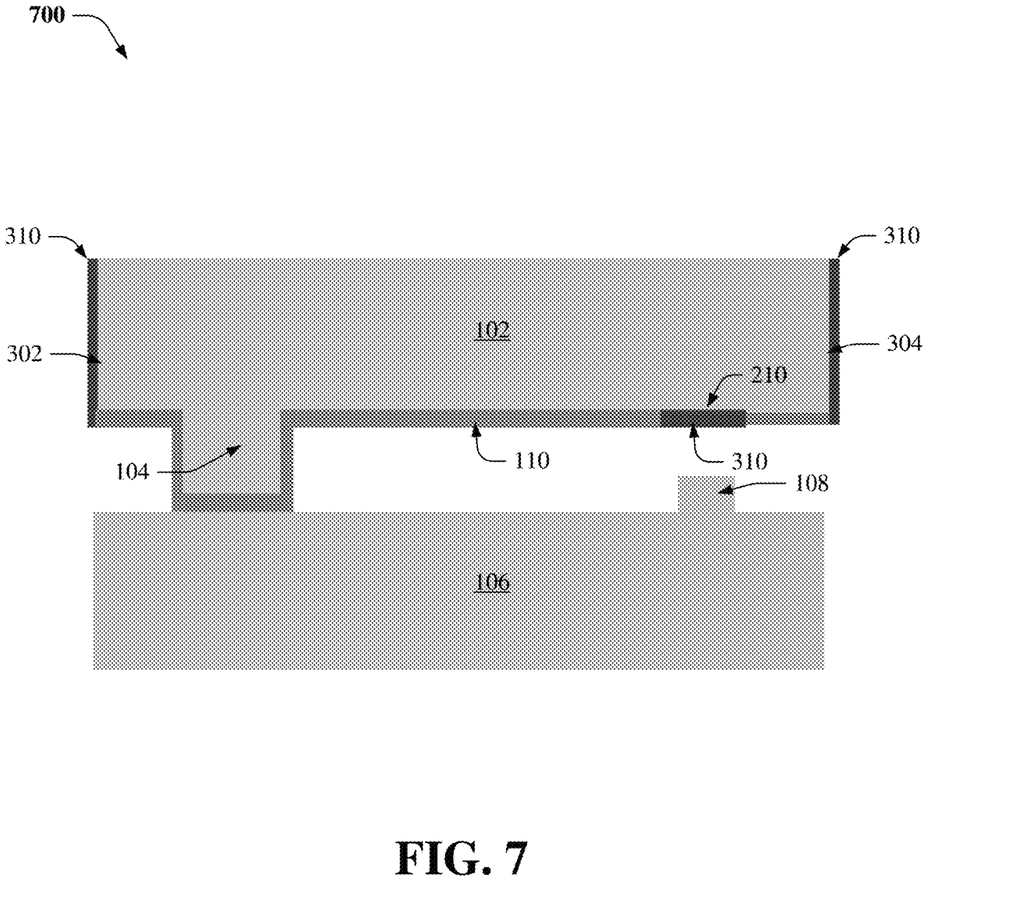
FIG. 7 illustrates a diagram of a cross section of the substrates in which the substrates have been attached across from each other with a defined contact area of one of the substrates being positioned across from a bump stop of another one of the substrates, in accordance with various example embodiments.

In other embodiment(s), in response to an application, e.g., via gas, deposition, etc. of a substance, chemical, etc. to the SAM coating that has been formed on the material, and based on the first adhesion force, force of adhesion, etc. being being less than the second adhesion force, force of adhesion, etc., the SAM coating that has been formed on the material can be removed In turn, and now referring to FIG. 7, the substrates (102, 106) can be attached across from each other with the defined contact area (210) of the first substrate (102) being positioned across from a bump stop (108) of a second substrate (106) of the substrates, in accordance with various example embodiments. In this regard, the first substrate can be attached to the second substrate via a standoff (104) of the first substrate, with the SAM coating that has been formed on the defined contact area being positioned across from the bump stop of the second substrate—the SAM coating reducing stiction between the defined contact area and the bump stop. It should be appreciated that although FIG. 7 illustrates the SAM coating has been formed on respective sidewalls of the first substrate, in other embodiment(s) (not shown), the first substrate can be attached to the second substrate via the standoff without the SAM coating being formed on the respective sidewalls of the first substrate.

Figure 8:
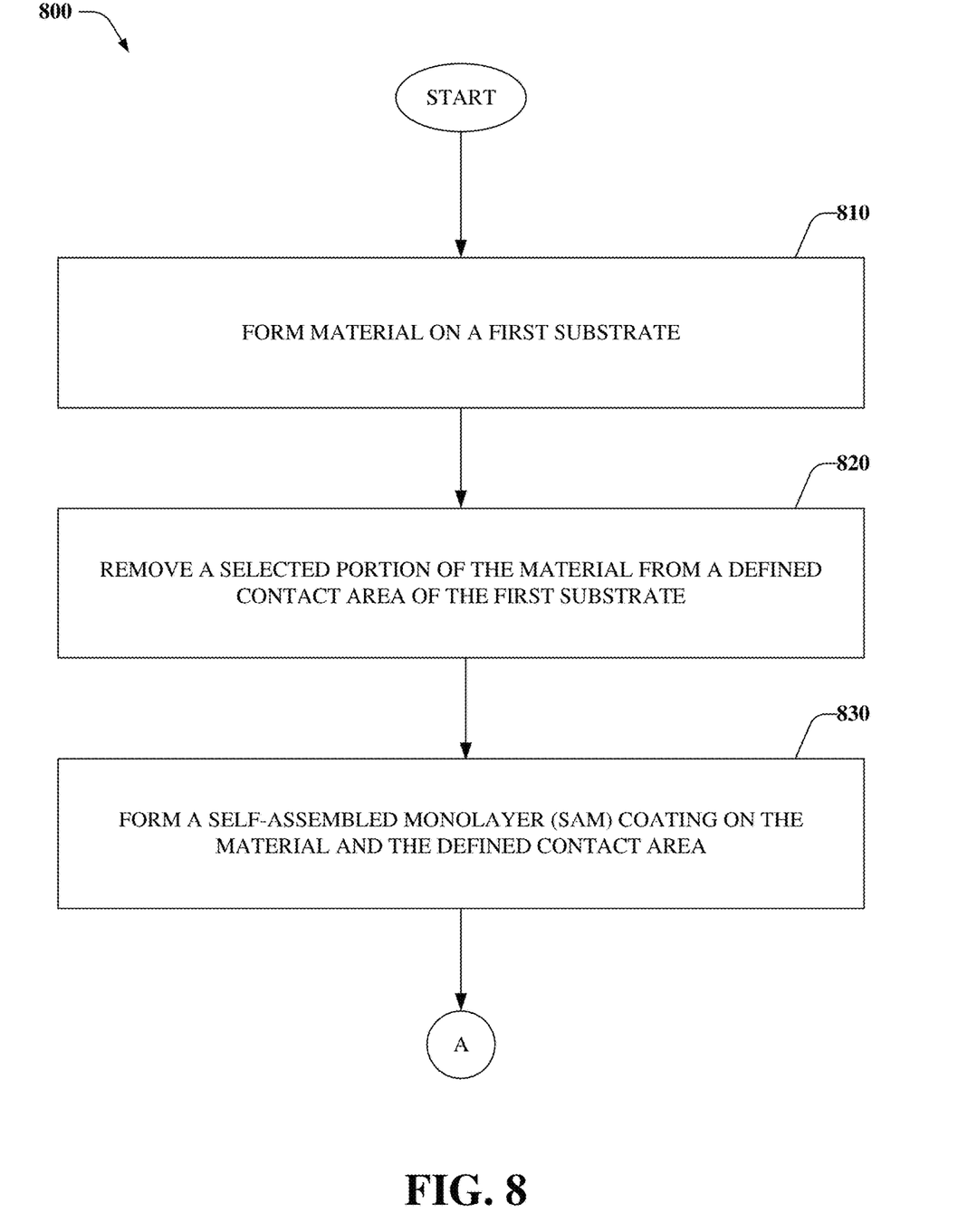
FIGS. 8-9 illustrate a method of manufacture for selectively controlling application of a SAM coating on a substrate of a device for facilitating a reduction of adverse effects of such coating on the device, in accordance with various example embodiments.
Figure 9:
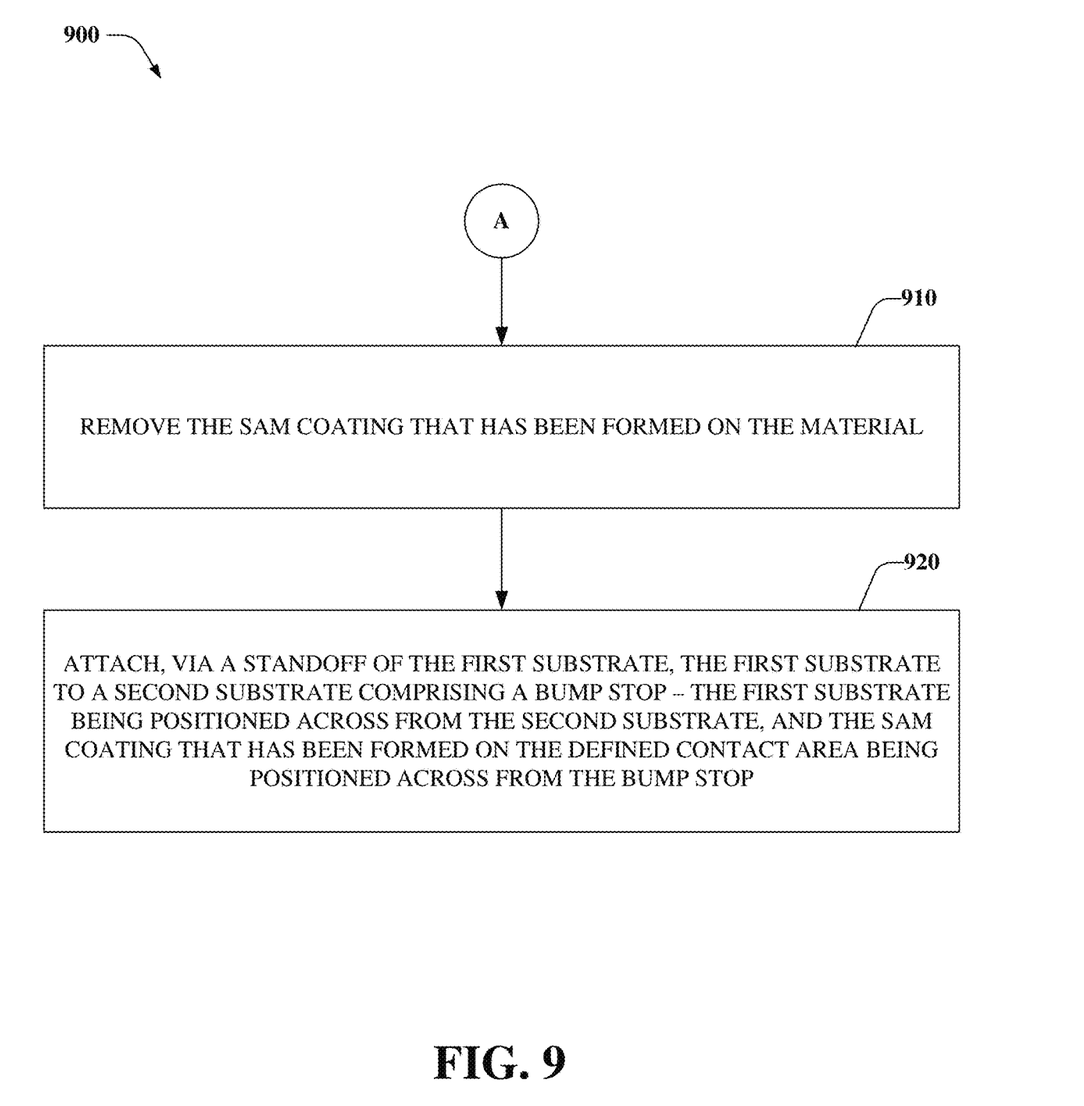

Now referring to FIGS. 8-9, a method of manufacture (800-900) for selectively controlling application of a SAM coating on a substrate of a device for facilitating a reduction of adverse effects of such coating on the device is illustrated, in accordance with various example embodiments. At 810, a material, e.g., germanium, can be formed, deposited, etc. on a first substrate, e.g., a silicon based substrate, a polysilicon based substrate, a proof mass (e.g., of a gyroscope, an accelerometer, etc.) . . . . At 820, a selected portion of the material can be removed, etched, etc. from a defined contact area of the first substrate. At 830, a SAM coating can be formed, deposited, etc. on the material and the defined contact area. In embodiment(s), the SAM coating can additionally be formed on respective sidewalls of the first substrate.

In embodiment(s), the SAM coating comprises a first adhesion force, force of adhesion, etc. with respect to the material, e.g., germanium, and a second adhesion force, force of adhesion, etc. with respect to the defined contact area of the first substrate, e.g., the defined contact area comprising silicon, and the first adhesion force, force or adhesion, etc. being less than the second adhesion force, force of adhesion, etc. In this regard, at 910, the SAM coating that has been formed on the material can be removed, e.g., based on the first adhesion force, force of adhesion, etc. being less than the second adhesion force, force of adhesion, etc., with the SAM coating that has been formed on the defined contact area remaining on the defined contact area.

In one embodiment, the SAM coating can be removed by heating the first substrate, the SAM coating, etc.—the SAM coating that has been formed on the defined contact area remaining on the defined contact area. In another embodiment, the SAM coating can be removed by applying (e.g., via gas, deposition, etc.) a substance, chemical, etc. to the SAM coating that has been formed on the material—the SAM coating that has been formed on the defined contact area remaining on the defined contact area.

Returning now to FIG. 9, at 920, the first substrate can be attached, via a standoff of the first substrate, to a second substrate (e.g., a CMOS substrate) comprising a bump stop—the first substrate being positioned across from the second substrate, and the SAM coating that has been formed on the defined contact area being positioned across from the bump stop, e.g., reducing stiction between the defined contact area and the bump stop.

Figure 10:
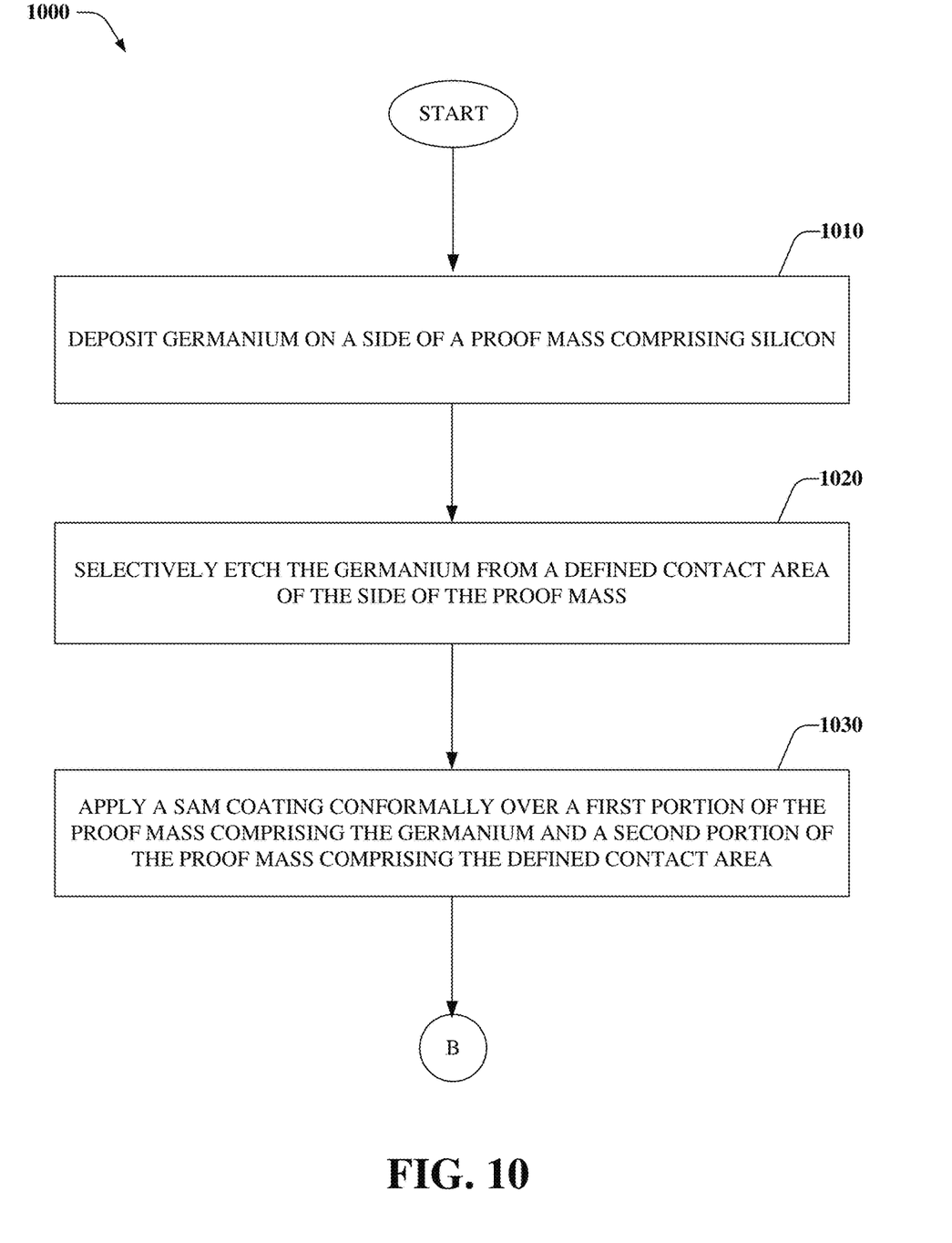
FIGS. 10-11 illustrate another method of manufacture for selectively controlling application of a SAM coating on a substrate of a device for facilitating a reduction of adverse effects of such coating on the device, in accordance with various example embodiments.
Figure 11:
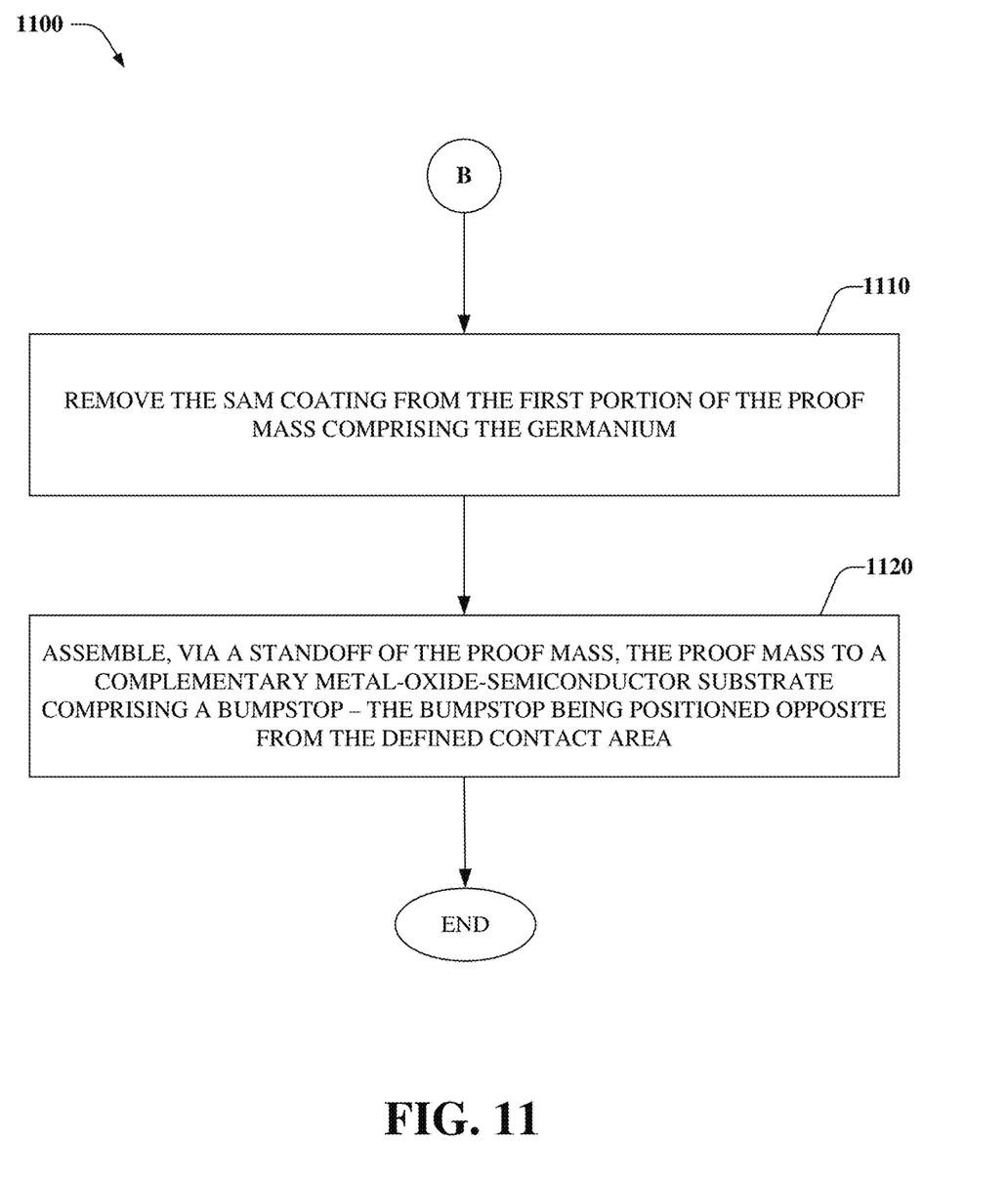

FIGS. 10-11 illustrate another method of manufacture (1000-1100) for selectively controlling application of a SAM coating on a substrate of a device for facilitating a reduction of adverse effects of such coating on the device, in accordance with various example embodiments. At 1010, germanium can be deposited on a side of a proof mass comprising silicon. At 1020, the germanium can be selectively etched from a defined contact area of the side of the proof mass. At 1030, a SAM coating can be applied conformally over a first portion of the proof mass comprising the germanium and a second portion of the proof mass comprising the defined contact area.

At 1110, the SAM coating can be removed from the first portion of the proof mass comprising the germanium. At 1120, the proof mass can be assembled, via a standoff of the proof mass, to a CMOS substrate comprising a bump stop—the bump stop being positioned opposite from the defined contact area.

In one embodiment, the SAM coating can be removed from the first portion of the proof mass comprising the germanium in response to heating the proof mass, the SAM coating, etc. In another embodiment, the SAM coating can be removed from the first portion of the proof mass comprising the germanium by chemically removing the SAM coating from the first portion of the proof mass comprising the germanium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
   forming a material on a first substrate;
   removing a selected portion of the material from a defined contact area of the first substrate;
   forming a self-assembled monolayer (SAM) coating on the material and the defined contact area, wherein the SAM coating comprises a first adhesion force with respect to the material and a second adhesion force with respect to the defined contact area of the first substrate, and wherein the first adhesion force is less than the second adhesion force;
   removing the SAM coating that has been formed on the material; and
   attaching the first substrate to the second substrate, wherein the first substrate is positioned across from the second substrate, and wherein the SAM coating that has been formed on the defined contact area is positioned across from a bump stop of the second substrate.

2. The method of claim 1, wherein the forming the material on the first substrate comprises:
   depositing a layer of germanium on a silicon substrate.

3. The method of claim 1, wherein the forming the material on the first substrate comprises:
   forming the material on a proof mass.

4. The method of claim 2, wherein the first substrate corresponds to an accelerometer or a magnetometer or a microphone.

5. The method of claim 3, wherein the proof mass is an accelerometer proof mass or a gyroscope proof mass.

6. The method of claim 3, wherein the second substrate is a complementary metal-oxide-semiconductor substrate.

7. The method of claim 1, wherein the removing the selected portion of the material comprises:
   etching the selected portion of the material from the defined contact area.

8. The method of claim 1, wherein the forming the SAM coating comprises:
   depositing the SAM coating on the material and the defined contact area.

9. The method of claim 1, wherein the forming the SAM coating comprises:
   forming the SAM coating on respective sidewalls of the first substrate.

10. The method of claim 1, wherein the removing the SAM coating comprises:
    in response the first substrate being heated, removing the SAM coating based on the first adhesion force with respect to the material.

11. The method of claim 1, wherein the removing the SAM coating comprises:
    in response to a substance being applied to the SAM coating, removing the SAM coating based on the first adhesion force with respect to the material.

12. The method of claim 1, wherein the attaching comprises:
    attaching, via a standoff of the first substrate, the first substrate to the second substrate.

13. A device, comprising:
    a first substrate comprising a surface, wherein the surface comprises
       a non-contact area that has been covered with a material comprising germanium, and
       a contact area that has been covered with a self-assembled monolayer (SAM) coating; and
    a second substrate that has been assembled across from the first substrate, wherein a bump stop of the second substrate is opposite from the contact area.

14. The device of claim 13, wherein first substrate comprises silicon, and wherein the second substrate is a complementary metal-oxide-semiconductor substrate.

15. The device of claim 14, wherein the first substrate comprises a proof mass.

16. The device of claim 13, wherein the device is an accelerometer or a gyroscope or a magnetometer or a microphone.

17. A method, comprising:
    depositing germanium on a side of a proof mass comprising silicon;
    selectively etching the germanium from a defined contact area of the side of the proof mass;
    applying a self-assembled monolayer (SAM) coating conformally over a first portion of the proof mass comprising the germanium and a second portion of the proof mass comprising the defined contact area;
    removing the SAM coating from the first portion of the proof mass comprising the germanium; and
    assembling, via a standoff of the proof mass, the proof mass to a complementary metal-oxide-semiconductor (CMOS) substrate, wherein a bump stop of the CMOS substrate is positioned opposite from the defined contact area.

18. The method of claim 17, wherein the removing the SAM coating comprises:
    in response to heating the proof mass, removing the SAM coating from the first portion of the proof mass comprising the germanium.

19. The method of claim 17, wherein the removing the SAM coating comprises:
    chemically removing the SAM coating from the first portion of the proof mass comprising the germanium.

20. The device of claim 13, wherein the SAM coating comprises a first adhesion force with respect to the non-contact area that is less than a second adhesion force with respect to the contact area.

* * * * *